United States Patent [19]

Harris et al.

[11] Patent Number: 5,339,067
[45] Date of Patent: Aug. 16, 1994

[54] INTEGRATED VOLTAGE DIVIDER AND CIRCUIT EMPLOYING AN INTEGRATED VOLTAGE DIVIDER

[75] Inventors: Larry L. Harris; Baker P. L. Scott, III, both of Austin, Tex.

[73] Assignee: Crystal Semiconductor Corporation, Austin, Tex.

[21] Appl. No.: 60,431

[22] Filed: May 7, 1993

[51] Int. Cl.$^5$ .............................................. H01C 1/14
[52] U.S. Cl. ..................... 338/323; 338/49; 338/324; 338/325; 338/333; 257/536; 381/104
[58] Field of Search ................. 338/49, 322, 323, 324, 338/325, 326, 330, 333; 323/364, 365, 366, 369; 257/536, 358; 381/104; 324/98

[56] References Cited

U.S. PATENT DOCUMENTS

| | | | |
|---|---|---|---|
| 3,666,995 | 5/1972 | Wensink et al. | 257/536 |
| 3,868,846 | 3/1975 | Kushida et al. | 324/98 X |
| 4,028,642 | 6/1977 | Kushida et al. | 323/366 |
| 4,028,718 | 6/1977 | Migitaka et al. | 357/27 |
| 4,181,878 | 1/1980 | Murari et al. | 323/94 R |
| 4,245,209 | 1/1981 | Bertotti et al. | 338/217 |
| 4,496,911 | 1/1985 | Lenz | 330/297 |

OTHER PUBLICATIONS

Dallas Semiconductor Part Data Sheets, DS1666, DS1666S Audio Digital Resistor, pp. 1–5, 1992, printed in USA.
Dallas Semiconductor Part Data Sheets, DS1267 Dual Digital Potentiometer Chip, pp. 750–757, 1990, printed in USA.
Toshiba Parts Data Sheets, TC9176P and TC9177P Audio Digital IC, p. 437 and 13 pages, date and place of printing unknown.
Crystal Semiconductor Corporation, Stereo Digital Volume Control Preliminary Product Information, pp. 1–11, Nov., 1992, printed in USA.
Ting, Chung-Yu, and Chen, Charles Y., "A Study of the Contacts of a Diffused Resistor," *Solid State Electronics*, 14:433–438, 1971, published in Europe.
Dialog Search Report dated Feb. 28, 1993, printed in USA.
SGS-Thomson Microelectronics, TDA7318, Digital Controlled Stereo Audio Processor, Advance Data, pp. 727–737, May 1991, printed in USA.
Williamsen, Mark, "Digitally Controlled Amplifier Takes 1-dB Steps," *Electronic Design News (EDN)*, pp. 210 and 212, May 7, 1992, published in USA.

*Primary Examiner*—Marvin M. Lateef
*Attorney, Agent, or Firm*—Arnold, White & Durkee

[57] ABSTRACT

An apparatus and method is provided for dividing a voltage with a resistor voltage divider and for employing the voltage divider in an integrated circuit. The resistor voltage divider utilizes inaccessible compensation taps that are placed between nonlinearly spaced output taps. The compensation taps reduce the impact of tap resistance on the voltage divider transfer function. The number of inaccessible compensation taps placed between output taps is dependant upon a chosen tap density that is substantially maintained across the body of the resistor voltage divider. The resistor may be used in integrated circuits employing amplifiers, such as volume control circuitry.

22 Claims, 12 Drawing Sheets

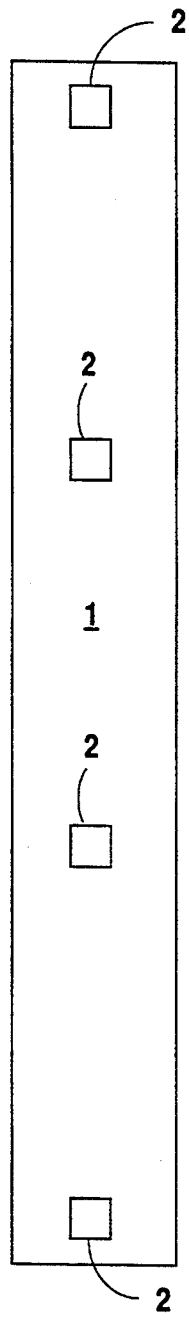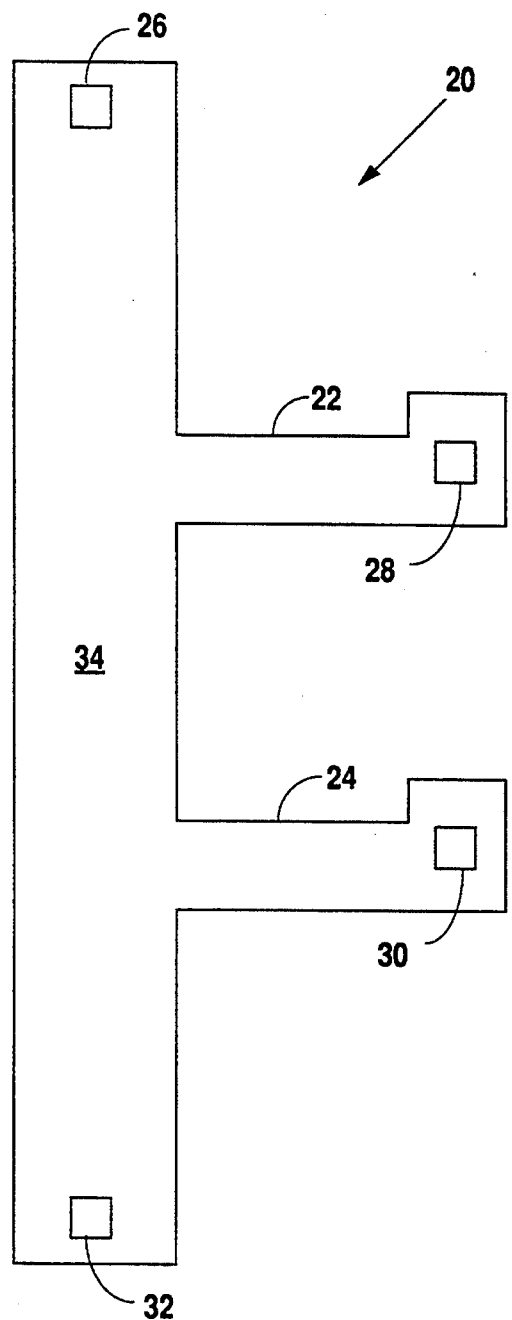
Fig. 1
(PRIOR ART)
Fig. 2
(PRIOR ART)

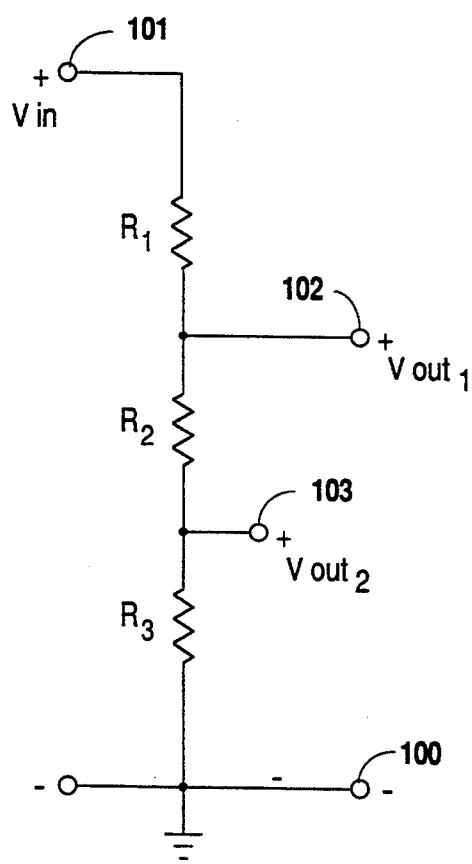
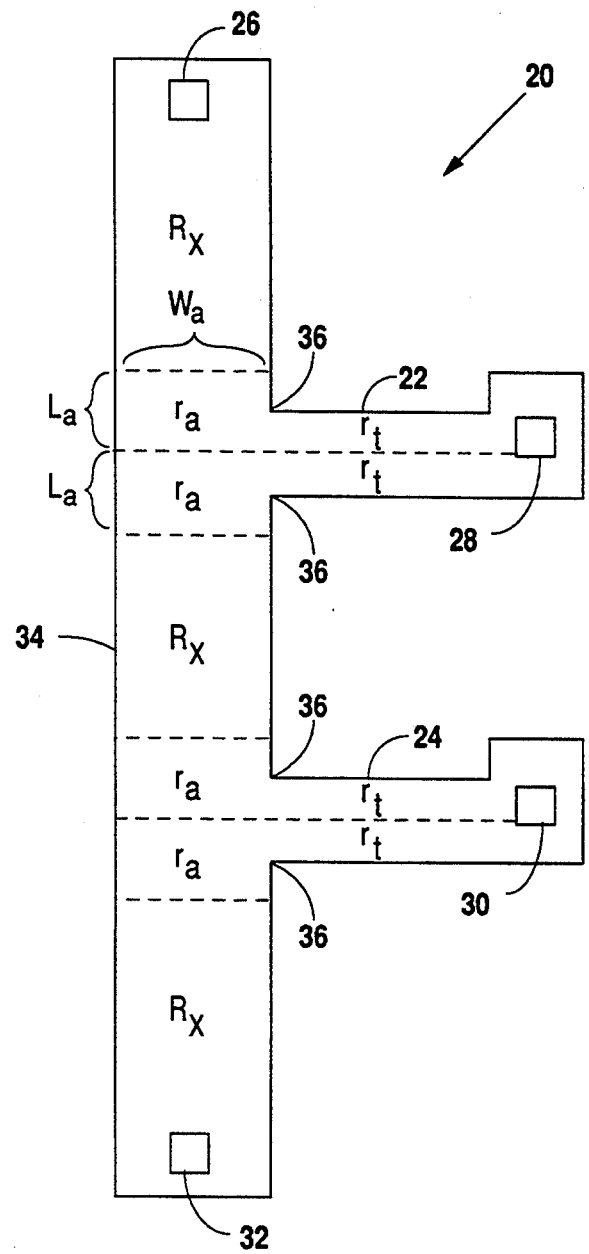
Fig. 3
( PRIOR ART )
Fig. 4
( PRIOR ART )

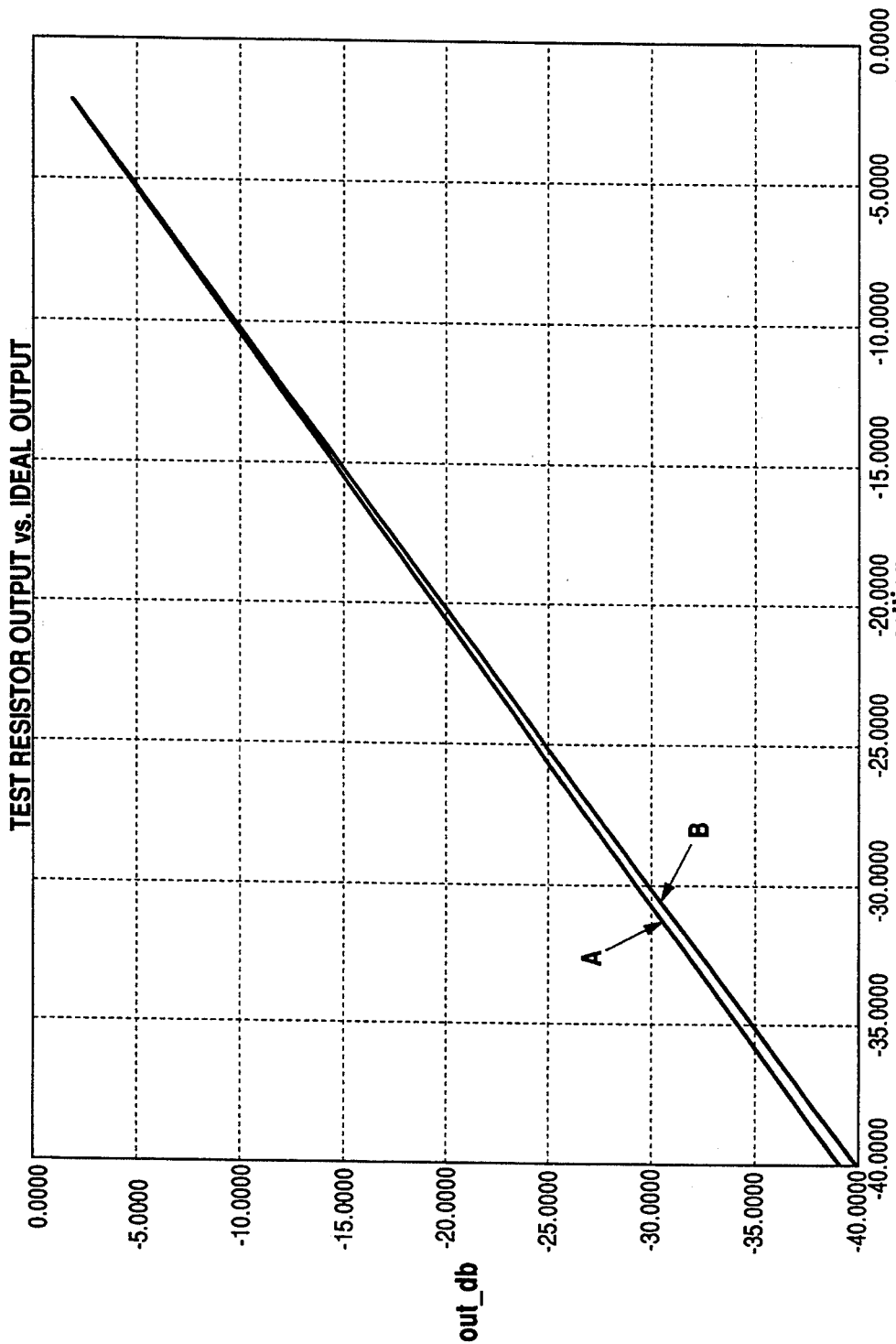

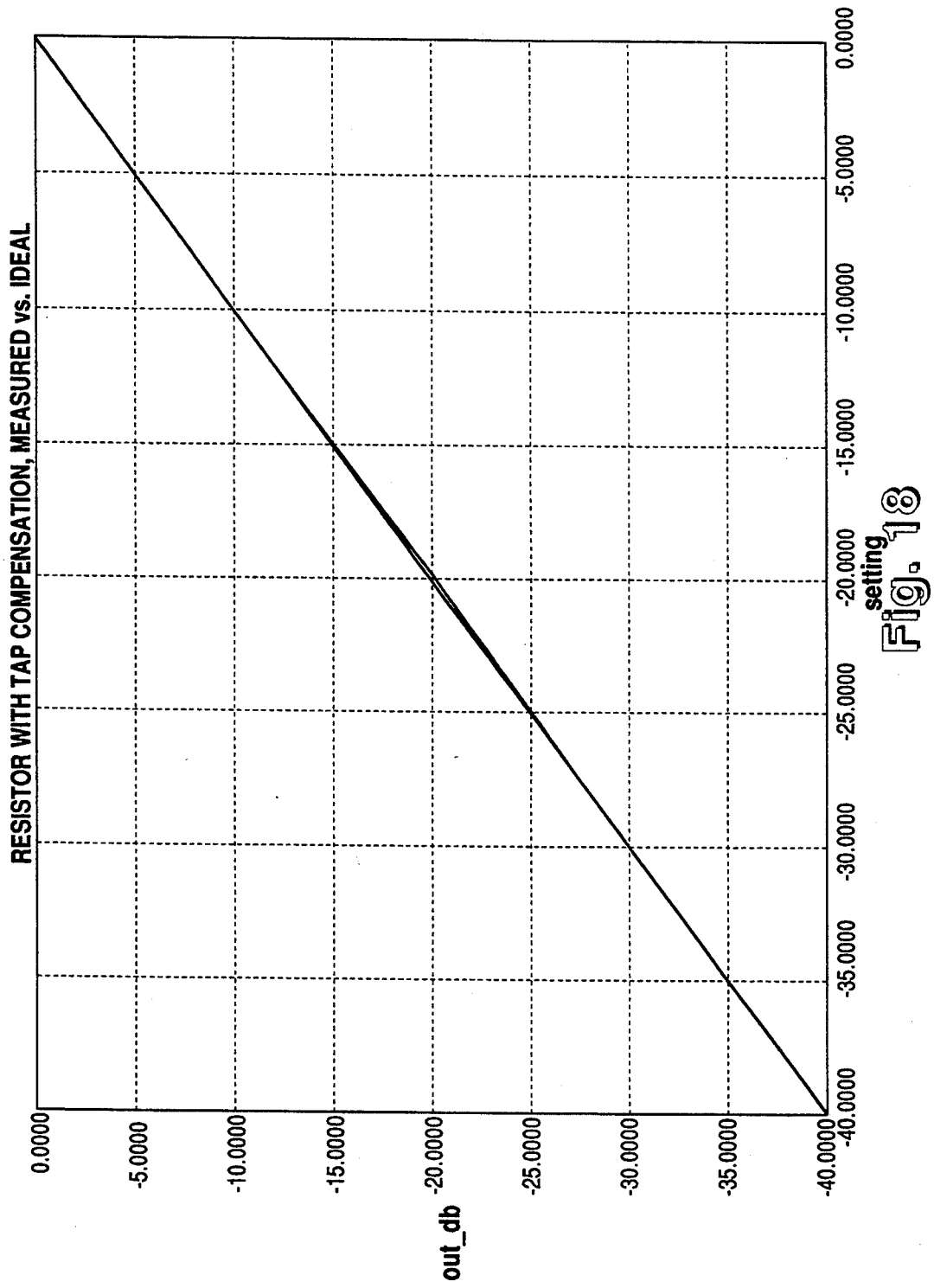

INTEGRATED VOLTAGE DIVIDER AND CIRCUIT EMPLOYING AN INTEGRATED VOLTAGE DIVIDER

BACKGROUND OF THE INVENTION

The present invention relates to resistors used for voltage dividers. More particularly, a device and method is provided for dividing a voltage across integrated circuit resistors.

Electronic resistors are fabricated by using several different techniques. Fabrication methods include depositing a thin or thick resistive films on a substrate or forming a resistive path directly within a substrate, typically silicon, by using a dopant species. Such resistors are often used in microelectronics applications such as integrated circuits and hybrid microcircuits. Such resistors may be used in a resistor divider network that is a discrete circuit or may be used as part of a complicated integrated circuit. Resistive films often include polysilicon or nickel-chrome and dopant species often include boron, phosphorus or arsenic. Regardless of the type of resistor material or fabrication process, the resistance of such a microelectronic resistor can be generally described by Equation 1:

$$R = \Omega/\square \times \frac{L}{W} \qquad (1)$$

where R is the resistor value in Ohms, $\Omega/\square$ is the sheet resistance in Ohms per square, L is the length of the resistor, and W is the width of the resistor. As known in the art, a square is dimensionless and is simply a portion of the resistor consisting of one unit length and one unit width.

Resistors may be used to create voltage dividers by providing a voltage across or current through the resistor and providing an output connection along some portion of the resistor. An individual voltage output of a microelectronic resistor voltage divider generally has a linear relationship with the voltage input of the resistor voltage divider. Furthermore, a voltage divider may have multiple outputs and each separate voltage output may have a linear relationship with the voltage input. On a voltage divider with multiple outputs, it is instructive to number each output consecutively starting from the top of the resistor divider progressing to the bottom of the resistor divider. When a plot is generated relating the input voltage attenuation of each output voltage to the respective output number, with one axis of the plot being the attenuation value and the other axis being the output number, this plot will be linear or nonlinear plot which is dependent upon the spacing of the outputs of the voltage divider.

Linear voltage dividers are defined as having a substantially linear plot of the voltage attenuation of each output and the related output numbers. Nonlinear voltage dividers are defined as having a substantially nonlinear plot of the voltage attenuation of each output and the related output numbers. The relationship between the outputs of the nonlinear voltage divider may be, for example, a logarithmic function, a square law function, or an exponential function. The individual transfer function between a voltage input and a specific output in a nonlinear voltage divider, though, may still be generally linear.

Voltage or current input and voltage output contact sites or taps may be made to a resistor in a variety of ways. FIG. 1 shows integrated circuit or hybrid microcircuit resistor 1 with taps 2 connecting from the top of the main body of resistor 1. In FIG. 1, taps 2 may simply consist of interconnect contacts, such as aluminum contacts. Alternatively, taps 2 may be upward extensions of the resistive film that are then connected to an interconnect lead. Other tap arrangements exist. For example, FIG. 2 shows resistor 20 having a main body 34 and output taps 22 and 24 which extend from main body 34 in order to provide a location for output contact sites 28 and 30. Input contact sites 26 and 32 are also provided. Many other geometric arrangements may be selected for taps. Furthermore, the tap spacing may be either linear or nonlinear along the resistor body. If all taps are spaced at substantially equal distance intervals along the resistor body, then linear spaced taps are created. Therefore, with linear spacing all resistor segments, whether between an input and an adjacent output or between adjacent outputs, are of equal length. If the taps are spaced such that all resistor segments are not of equal length than nonlinear tap spacing has been created.

Generally, contact sites, taps, and their placement will have some impact on each specific electrical transfer function of the voltage divider and, thus, will vary the actual transfer function from the transfer function of an ideal voltage divider. It is desirable to lessen the impact that output connections have on a transfer function of a resistor voltage divider. Furthermore, the impact of output connections is generally more severe in nonlinear voltage dividers than in linear voltage dividers. Therefore, it is desirable to lessen the impact of taps in nonlinear voltage dividers such as, for example, voltage dividers that allow logarithmic attenuation.

Microelectronic linear voltage dividers are generally made by providing linearly spaced output taps along the resistor body, while microelectronic nonlinear voltage dividers are generally made by providing nonlinear spacing of the output taps of a voltage divider. Alternatively, it is known in the art to provide a series of linearly spaced taps where all taps are accessible to the user, and allow a user to select the specific desired output taps. Thus, a user may use a voltage divider that has linearly spaced taps as a nonlinear voltage divider by only selecting outputs that have substantially nonlinearly related transfer functions. Furthermore, by providing only linear spaced outputs, a desired output voltage that requires nonlinear spacing of taps can only be approximated. Though such systems may lessen the impact of tap resistance, excess circuitry space may be consumed because these systems may allow the user to access every tap, and thus, every tap has some corresponding access and decoding interconnects and circuitry. It is, therefore, desirable to lessen the impact resulting from tap connections while limiting the amount of circuit space and complexity, and provide a very accurate representation of the desired nonlinearly related transfer functions.

SUMMARY OF THE INVENTION

The problems outlined above are in a broad aspect addressed by the device and method of the present invention. That is, the apparatus and method of the present invention lessens the impact of taps in voltage dividers that have nonlinearly related transfer functions while maintaining a very accurate representation of the desired nonlinearly related transfer functions.

The present invention includes a resistor voltage divider that has a plurality of accessible output taps distributed along a resistor body. In addition, at least one inaccessible compensation tap is also placed along the resistor body. The accessible output taps may be nonlinearly distributed. In a preferred embodiment, the accessible output taps are logarithmically distributed. Furthermore, the taps are distributed such that a chosen tap density is substantially constant over a portion of the resistor body. Generally, the tap density between one accessible output tap and an input tap to the resistor voltage divider is substantially equal to the tap density between a second accessible output tap and the input tap. Moreover, the tap density between each output tap and an input tap may be substantially constant. Finally, the taps may be spaced such that the taps are substantially linearly distributed along the resistor bodies.

The present invention also includes a voltage divider circuit utilizing an integrated circuit resistor body having a plurality of taps and electrical leads connected to at least two of those taps. Further, the circuit has tap selection circuitry connected to the electrical leads such that the tap selection circuitry may electrically select some, but not all of the taps, whereby at least one of the taps is not selectable and at least two of the taps are selectable. In addition, the taps may comprise accessible output taps and at least one inaccessible compensation tap which may be placed along the resistor body to substantially minimize a tap resistance error in the transfer function of the circuit. Finally, at least one of the inaccessible compensation taps of the circuit may be structurally disconnected from the input of the tap selection circuitry.

The voltage divider may be made by placing a plurality of accessible output taps along the resistor body in a desired nonlinear spacing pattern. Thus, resistor segments with nonlinear lengths between adjacent accessible output taps are created. Then, inaccessible compensation taps are placed along the resistor body in order to substantially minimize tap resistance effects. The tap resistance effects may be minimized by selecting a predetermined tap density and placing inaccessible compensation taps to substantially maximize the equality of the tap density in each nonlinear length resistor segment. Furthermore, the placement of the inaccessible tap may create substantially linear tap spacing along the resistor body when all of the taps are considered.

The resistor voltage divider in the present invention is particularly useful when used in an integrated circuit amplifier circuit. A resistor voltage divider is operatively connected to an amplifier. The resistor voltage divider has a plurality of successful output taps, at least one inaccessible compensation tap and an input tap distributed along the resistor body. The taps are distributed such that a tap density between one accessible output tap and the input tap, and the tap density between a second accessible output tap and the input taps are substantially equal. The voltage divider may be connected to a voltage source and one of the accessible output taps connected to a signal input of the amplifier. Further, the voltage divider may be connected to the signal output of the amplifier and one of the accessible output taps then connected to the feedback input of the amplifier. Alternatively, one voltage divider may be operatively connected to the signal input of the amplifier and a second voltage divider operatively connected to the feedback input of the amplifier.

Finally, it is noted that with the present invention, a nonlinear volume control circuit may utilize circuitry that includes an amplifier and two resistor voltage dividers each having a plurality of accessible output taps, at least one inaccessible compensation tap, and an input tap. The taps are distributed whereby the tap density between an output tap and an input tap is substantially equal to the tap density between a second output tap and the input tap. Furthermore, multiplexer circuits are provided for decoding one of the accessible output taps and connecting the output tap to a signal input or a feedback input of an amplifier.

BRIEF DESCRIPTION OF THE DRAWINGS

FIG. 1 is a plan view of a microelectronic resistor with contact sites within the main body of the resistor.

FIG. 2 is a plan view of a microelectronic resistor voltage divider with taps.

FIG. 3 is a schematic of an ideal resistor voltage divider.

FIG. 4 is a plan view of a resistor voltage divider incorporating tap resistance effects.

FIG. 12 is an expanded view of a tap shown in FIG. 11.

FIG. 16 shows a graph of the measured attenuation verses ideal attenuation of an integrated circuit resistor voltage divider without inaccessible compensation taps.

FIG. 18 shows a graph of the measured attenuation verses ideal attenuation of an integrated circuit resistor voltage divider with inaccessible compensation taps.

DETAILED DESCRIPTION

Figure 5:
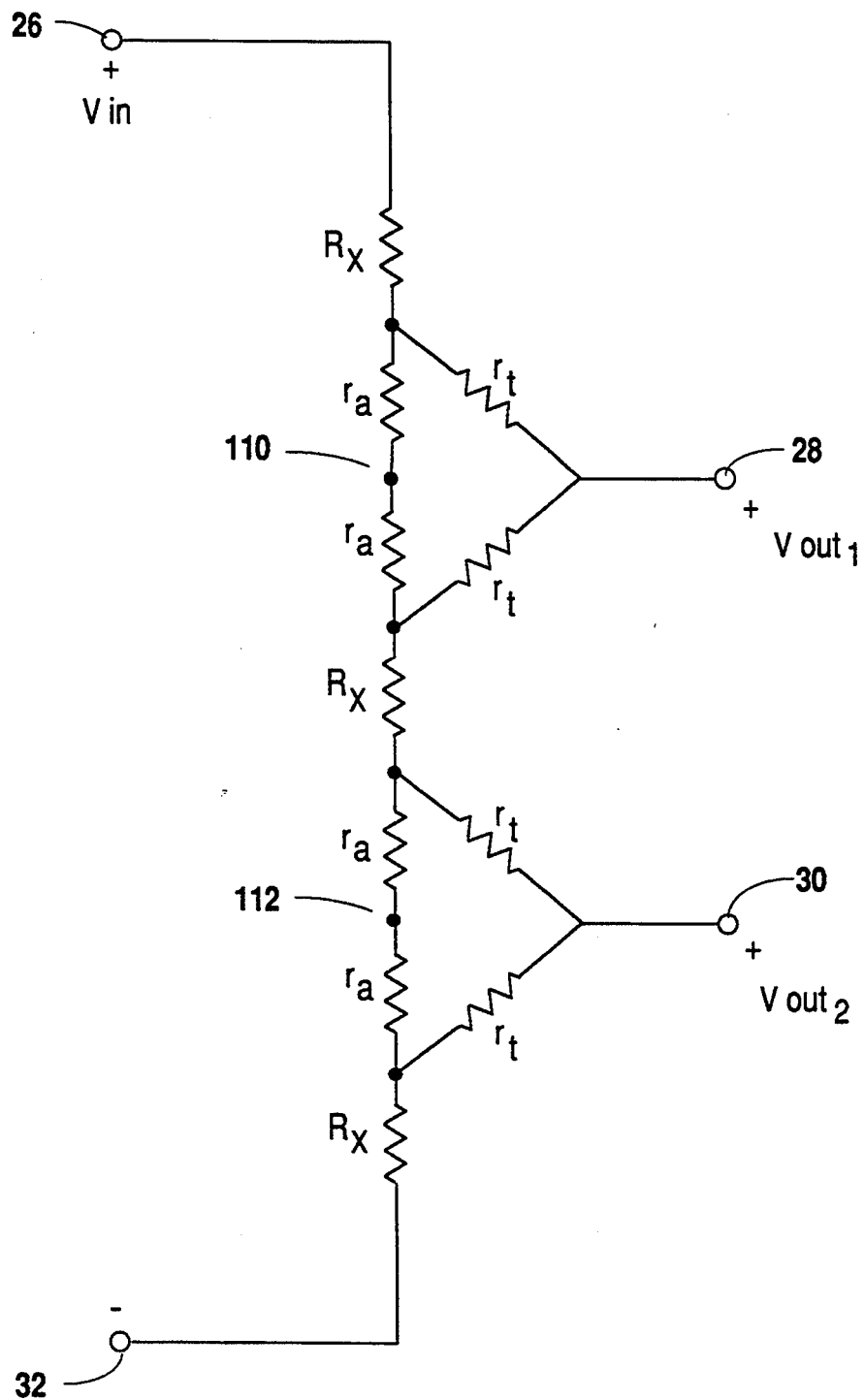
FIG. 5 is a schematic of the integrated circuit resistor voltage divider shown in FIG. 4.

The schematic of an ideal resistor voltage divider is shown in FIG. 3. Three integrated circuit resistors are shown as $R_1$, $R_2$, and $R_3$. However, it is understood that the number of resistors may be $R_n$ where $n = 1,2,3 \ldots$ The resistors have a length $L_1$, $L_2$, and $L_3$, and width $W_1$, $W_2$, and $W_3$ respectively. The voltage drop between node 101 and node 100 is Vin, the voltage drop between node 102 and node 100 is Vout$_1$, and the voltage drop between node 103 and node 100 is Vout$_2$. The relationship between the input and output voltages (i.e., the voltage transfer function) of the voltage divider of FIG. 1 is shown in Equation 1a:

$$\frac{Vout_1}{Vin} = \frac{R_2 + R_3}{R_1 + R_2 + R_3} = \frac{R_2 + R_3}{R_{TOTAL}} \quad (1a)$$

where $R_{TOTAL} = R_1 + R_2 + R_3$

If all the resistors are made of the same material and thus have the same sheet resistance, substituting Equation 1 into Equation 1a yields Equation 1b:

$$\frac{Vout_1}{Vin} = \frac{\Omega/\square \left( \frac{L_2}{W_2} + \frac{L_3}{W_3} \right)}{\Omega/\square \left( \frac{L_1}{W_1} + \frac{L_2}{W_1} + \frac{L_3}{W_3} \right)} = \quad (1b)$$

$$\frac{\frac{L_2}{W_2} + \frac{L_3}{W_3}}{\frac{L_1}{W_1} + \frac{L_2}{W_2} + \frac{L_3}{W_3}}$$

If the width of each resistor is the same, Equation 1b reduces to Equation 2:

$$\frac{Vout_1}{Vin} = \frac{L_2 + L_3}{L_1 + L_2 + L_3} \quad (2)$$

If the length of each resistor is the same, then the voltage relationship shown in Equation 2 further simplifies to the relationship shown in Equation 3:

$$\frac{Vout_1}{Vin} = \frac{2L}{3L} = \frac{2}{3} \quad (3)$$

Similarly, with the same assumptions as for Equation 3, Equation 4 may be obtained:

$$\frac{Vout_2}{Vin} = \frac{L_3}{L_1 + L_2 + L_3} = \frac{1}{3} \quad (4)$$

Thus for ideal voltage dividers with resistors of equal length, equal width and equal sheet resistance, Equations 2, 3, and 4 show that the voltage transfer functions are simply the ratio of the resistor lengths.

A microelectronic resistor voltage divider 20 with linearly spaced output taps is shown in FIG. 2. In order to contact voltage divider 20, accessible outputs or tap connections are generally provided. FIG. 2 shows integrated circuit resistor voltage divider 20 and taps 22 and 24. Taps 22 and 24 are equally spaced along main body 34 of voltage divider 20 in order to create resistors of equal length. Connection sites 26, 28, 30 and 32 are also shown in FIG. 2. Adding taps to voltage divider 20 will result in the creation of parasitic tap resistances between tap connection sites 28 and 30 and main body 34 of voltage divider 20. The effect of a tap is to place parasitic resistors, $r_t$, associated with the tap in parallel with small resistor segments, $r_a$, of the body of the resistor that is effected by $r_t$ as shown in FIG. 4. Each resistor segment $r_a$, has a length $L_a$ and width, $W_a$, as shown in FIG. 4. Similarly, resistor segments $r_t$ have effective lengths $L_t$ and effective widths $W_t$. Resistor segments $r_a$ will slightly extend past corners 36 where taps 22 and 24 connect to main body 34 because of current dispersions effects around corners 36. Assuming that main body 34 of voltage divider 20 has a constant width and uniform sheet resistance, then the remainder of main body 34 of voltage divider 20 may be represented by equal resistance resistor segments $R_x$.

Figure 6:
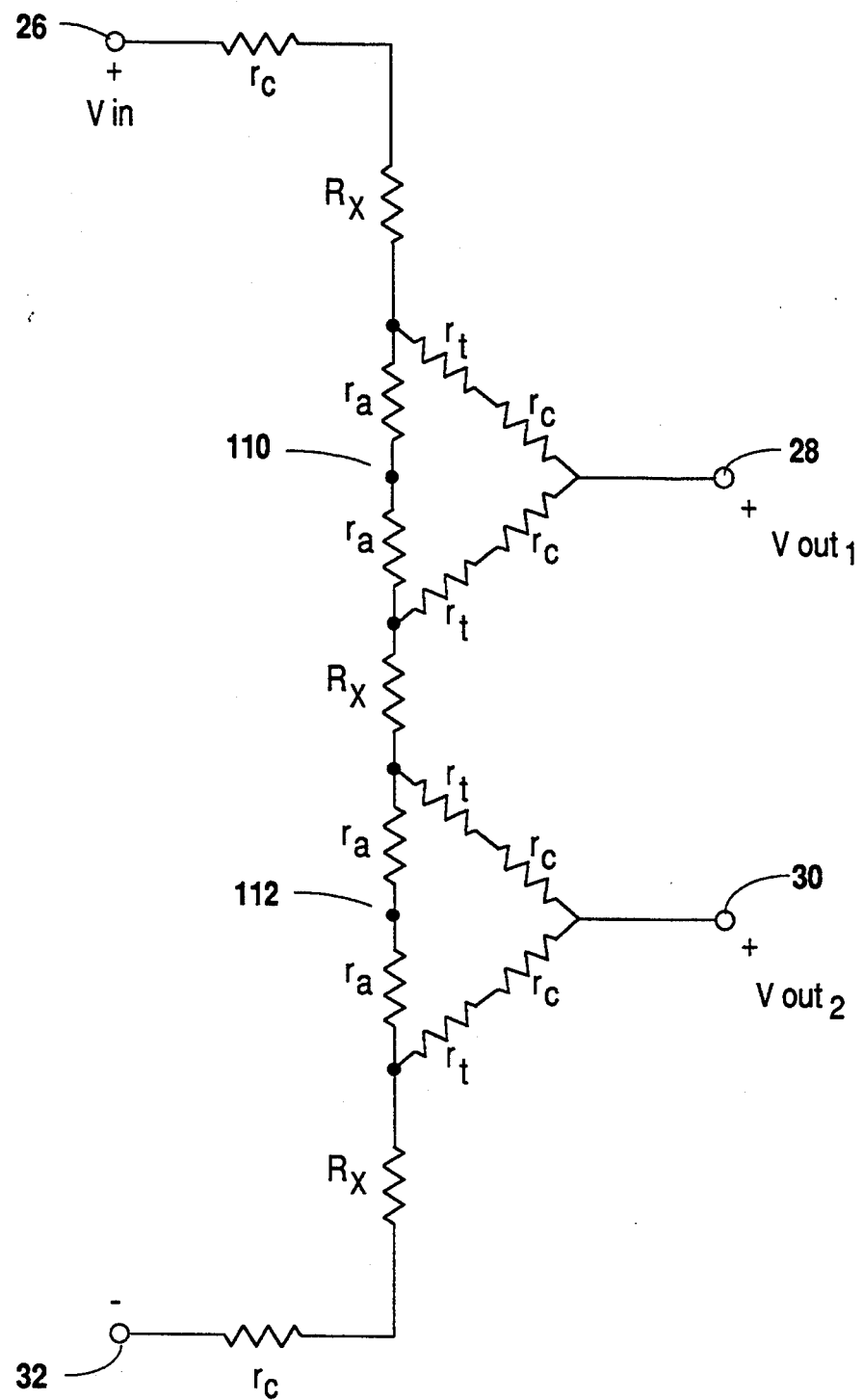
FIG. 6 is a schematic of the voltage divider shown in FIG. 5 including contact resistance.

FIG. 5 is a schematic representation of resistor voltage divider 20. Shown in FIG. 6 is the resistance effects of the interface of an interconnect contact at connection sites 26, 28, 30, and 32. The contact resistance $r_c$ is in series with tap resistance $r_t$ contact sites 28 and 30. If the contact resistance $r_c$ at connection sites 26 and 32 is small compared to $R_x$, then $r_c$ may be neglected at these two connection sites. If the contact resistance $r_c$ at connection sites 26 and 32 is significant with respect to $R_x$, the $r_c$ may be canceled out by the use of Kelvin contacts. Kelvin Contacts, well known in the art, provide a means of applying a voltage that is substantially independent of the input contact resistance.

The contact resistance $r_c$ at connection sites 28 and 30 may effect the value of $r_t$ which in turn may effect the value of the voltage divider output. Further, the contact resistance $r_c$ will have a different temperature coefficient than $r_t$, thus the overall effective tap resistance will have a different temperature coefficient than the body of the resistor. This difference in the temperature coefficient will cause a change in the divider output voltage with respect to temperature. It will be shown that regardless of the value of $r_t$, $r_t$ can be substantially compensated for with the present invention. Therefore, in the discussion that follows, only $r_t$ will be discussed and not $r_t$ plus $r_c$.

Figure 7:
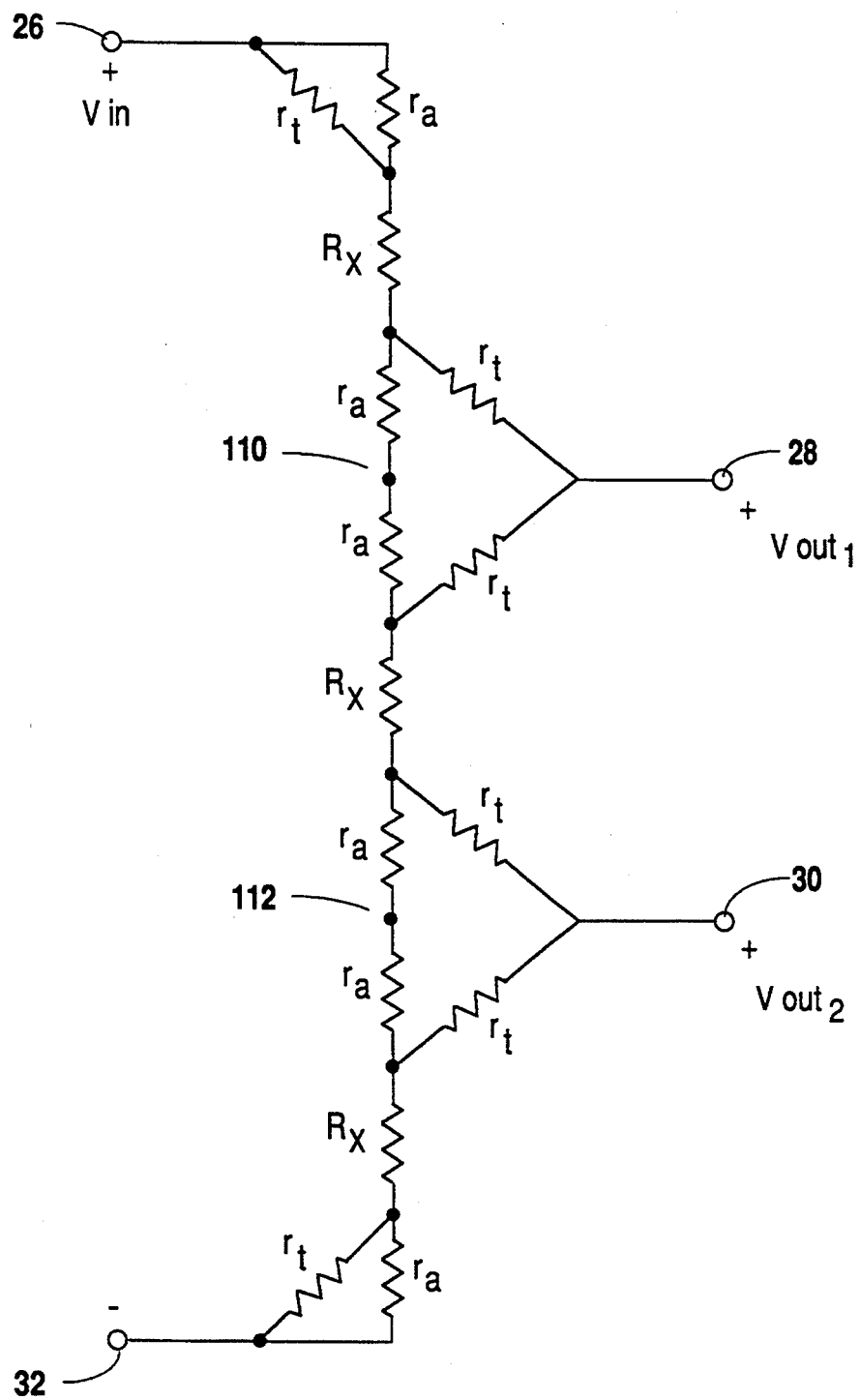
FIG. 7 is another schematic of the integrated circuit resistor voltage divider shown in FIG. 4.

Node 110 in FIGS. 5 and 6 has the same potential as tap connection site 28 and node 112 has the same potential as tap connection site 30. The circuit shown in FIG. 6 may be approximated by the circuit shown in FIG. 7. FIG. 7 is only an approximation because additional $r_a$ and $r_t$ resistors are added at each end of the voltage divider. Though three resistors, $R_x$, are shown in FIG. 7, it is understood that many $R_x$ resistors may be used. Thus, the error introduced by the approximation will be small. Furthermore, contacts 26 and 32 may be Kelvin contacts with a sense tap constructed similar to the voltage divider output taps. FIG. 7 provides a schematic representation of the voltage divider configured in this manner. Kelvin contacts, well known in the art, provide a means of applying a voltage that is independent of the input contact resistance. Thus error added by input contact impedance may be lessened by using Kelvin input contacts. The schematic of FIG. 7 may be simplified if an equivalent resistor $R_E$ is used where $R_E$ is defined in Equation 5 as:

$$R_E = R_x + 2 \frac{r_a r_t}{r_a + r_t} \quad (5)$$

Figure 8:
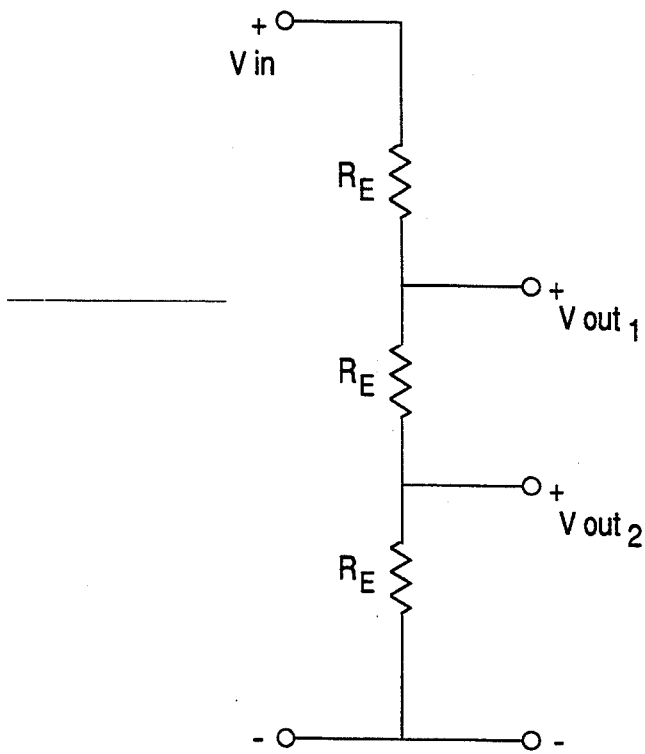
FIG. 8 is an equivalent resistor version of the schematic shown in FIG. 7.

A schematic representation using equivalent resistor $R_E$ is shown in FIG. 8.

Figure 9:
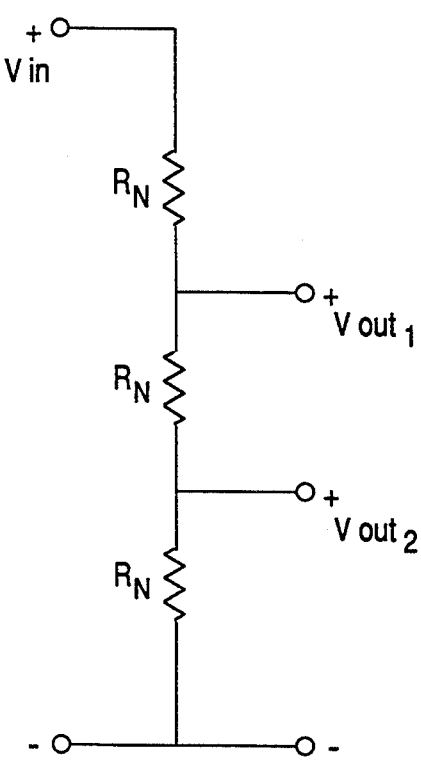
FIG. 9 is a version of the schematic shown in FIG. 7 without tap resistance.

If there was no parasitic tap resistance, $r_t$, the schematic of FIG. 7 may be shown as the schematic in FIG. 9. An equivalent resistor $R_N$ can be used as shown in FIG. 9 where $R_N$ is defined in Equation 6 as:

$$R_N = R_x + 2r_a \quad (6)$$

Subtracting Equation 5 from Equation 6 results in a $\Delta R$ term. $\Delta R$ thus represents the change in the ideal resistor when a parasitic tap resistance, $r_t$, is considered and may be shown to be:

$$\Delta R = R_x + 2r_a - R_x - 2\frac{r_a r_t}{r_a + r_t} = 2\left(r_a - \frac{r_a r_t}{r_a + r_t}\right) \quad (7)$$

Now calculating a voltage transfer function for $Vout_1$ when parasitic tap resistances are included yields Equation 9:

$$\frac{Vout_1}{Vin} = \frac{(R_N - \Delta R) + (R_N - \Delta R)}{(R_N - \Delta R) + (R_N - \Delta R) + (R_N - \Delta R)} = \quad (9)$$

$$\frac{2(R_N - \Delta R)}{3(R_N - \Delta R)} = 2/3$$

and similarly $$\frac{Vout_2}{VIN} = \frac{R_N - \Delta R}{3(R_N - \Delta R)} = \frac{1}{3} \quad (10)$$

As noted above, the taps were equally spaced in the configurations of FIGS. 4–9, therefore, Equations 9 and 10 are only valid for equal spacing. Therefore, for linear spacing, the equations above demonstrate that the voltage transfer function will be substantially independent of the parasitic tap resistance.

Figure 10:
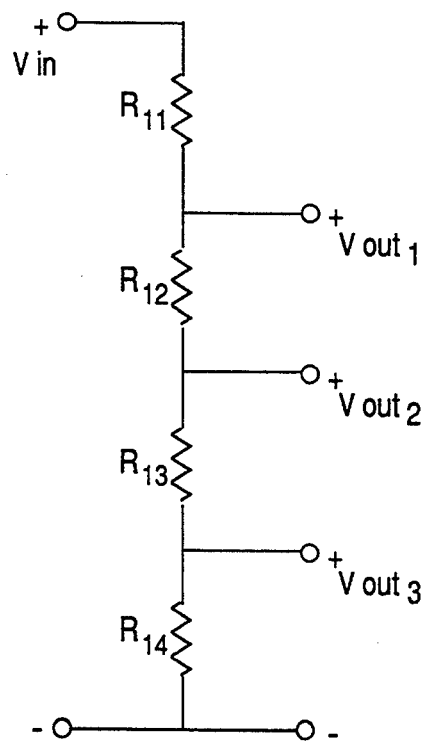
FIG. 10 is schematic of a nonlinear integrated circuit resistor voltage divider.

A voltage divider with a nonlinearly related transfer functions may be obtained by using nonlinear spacing between the taps rather than equal (i.e. linear) spacing. For example, the spacing may follow a logarithmic pattern, square root pattern, or other patterns. FIG. 10 is schematic of a voltage divider having nonlinearly related transfer functions without including parasitic tap resistances. When a uniform width and sheet resistance are used, Equations 11a and 11b represent the voltage transfer functions:

$$\frac{Vout_1}{Vin} = \quad (11a)$$

$$\frac{R_{12} + R_{13} + R_{14}}{R_{11} + R_{12} + R_{13} + R_{14}} = \frac{L_{12} + L_{13} + L_{14}}{L_{11} + L_{12} + L_{13} + L_{14}}$$

$$\frac{Vout_2}{Vin} = \quad (11b)$$

$$\frac{R_{13} + R_{14}}{R_{11} + R_{12} + R_{13} + R_{14}} = \frac{L_{13} + L_{14}}{L_{11} + L_{12} + L_{13} + L_{14}}$$

where $L_{11}$, $L_{12}$, $L_{13}$, and $L_{14}$ are nonlinearly, such as logarithmically, different lengths.

Including parasitic tap resistance as discussed above for the linear voltage divider yields a transfer function as shown in equation 12a:

$$\frac{Vout_1}{Vin} = \quad (12a)$$

$$\frac{(R_{12} - \Delta R) + (R_{13} - \Delta R) + (R_{14} - \Delta R)}{(R_{11} - \Delta R) + (R_{12} - \Delta R) + (R_{13} - \Delta R) + (R_{14} - \Delta R)}$$

Unlike the linear voltage divider, the nonlinear voltage divider with nonlinearly spaced taps has transfer functions that are not independent of the taps, because the $\Delta R$ term, and thus $r_t$, is present in the transfer function. The tap dependency of the voltage divider may be compensated for by adjusting the lengths of $L_{11}$, $L_{12}$, $L_{13}$, and $L_{14}$. However, $r_t$ may vary because $r_t$ is sensitive to temperature and process variations. For example, because the tap widths are generally much smaller than the main resistor body widths, critical linewidth dimension variations during integrated circuit processing will disproportionately change the $r_t$ resistance as compared to resistance changes in the main body of the resistor. Likewise, temperature variations, may impact the voltage divider. For example, the tap resistance may be dependant on the interface resistance of a connection site within a tap as discussed above and such interface effects may have a temperature dependency. Interface effects, though, will have less impact as the length of a tap is increased. Thus, even if the resistor lengths $L_{11}$–$L_{14}$ are adjusted, error will still result due to process and temperature variations.

Using the present invention, though, it is possible to create a voltage divider with nonlinearly related transfer functions that is less sensitive to the parasitic tap resistance. In the present invention, extra inaccessible compensation taps are added such that the number of taps in each resistor segment $R_{11}$, $R_{12}$, $R_{13}$ and $R_{14}$ is proportional to the length $L_{11}$, $L_{12}$, $L_{13}$ and $L_{14}$ of each resistor segment. This will result in the ratio of the number of taps in a particular resistor segment to the total number of taps in the voltage divider being substantially equal to the ratio of the length of that particular resistor segment to the total length of the voltage divider ($L_{11}+L_{12}+L_{13}+L_{14}$).

Thus, if $\Delta R$ is expressed as $$\Delta R = \frac{T_{tot}}{L_{tot}} \times \Delta r \times L_{seg} \quad (13a)$$

where $L_{seg}$ = the length of the resister segment.
$T_{tot}$ = the total number of taps in the voltage divider (both desired accessible output taps and extra inaccessible compensation taps).
$L_{tot}$ = the total length of the voltage divider, then Equation 12a may be rewritten as Equation 13b.

$$\frac{Vout_1}{Vin} = \frac{\left(R_{12} - \frac{T_{tot}}{L_{tot}}\Delta r L_{12}\right) + \left(R_{13} - \frac{T_{tot}}{L_{tot}}\Delta r L_{13}\right) + \left(R_{14} - \frac{T_{tot}}{L_{tot}}\Delta r L_{14}\right)}{\left(R_{11} - \frac{T_{tot}}{L_{tot}}\Delta r L_{11}\right) + \left(R_{12} - \frac{T_{tot}}{L_{tot}}\Delta r L_{12}\right) + \left(R_{13} - \frac{T_{tot}}{L_{tot}}\Delta r L_{13}\right) + \left(R_{14} - \frac{T_{tot}}{L_{tot}}\Delta r L_{14}\right)} \quad (13b)$$

In terms of sheet resistance, Equations 14a and 14b may be used:

$$\Delta r = \Omega/\Box \times \frac{L_t}{W_t} \times k \quad (14a)$$

where k is a constant and $$R_n = \Omega/\square \times \frac{L_n}{W} \tag{14b}$$

where the $\Omega/\square$ in Equations 14a and 14b is the same value. Substituting Equations 14a and 14b into Equation 13 yields Equations 15a and 15b:

$$\frac{Vout_1}{Vin} = \tag{15a}$$

$$\frac{\Omega/\square\left[\left(\frac{L_2}{W} - \frac{T_{tot}}{L_{tot}}\frac{L_t}{W_t}L_{12}k\right) + \left(\frac{L_3}{W} - \frac{T_{tot}}{L_{tot}}\frac{L_t}{W_t}L_{13}k\right) + \left(\frac{L_4}{W} - \frac{T_{tot}}{L_{tot}}\frac{L_t}{W_t}L_{14}k\right)\right]}{\Omega/\square\left[\left(\frac{L_1}{W} - \frac{T_{tot}}{L_{tot}}\frac{L_t}{W_t}L_{11}k\right) + \left(\frac{L_2}{W} - \frac{T_{tot}}{L_{tot}}\frac{L_t}{W_t}L_{12}k\right) + \left(\frac{L_3}{W} - \frac{T_{tot}}{L_{tot}}\frac{L_t}{W_t}L_{13}k\right) + \left(\frac{L_4}{W} - \frac{T_{tot}}{L_{tot}}\frac{L_t}{W_t}L_{14}k\right)\right]}$$

$$= \frac{(L_2 + L_3 + L_4)\left(\frac{1}{W} - \frac{T_{tot}}{L_{tot}}\frac{L_t}{W_t}k\right)}{(L_1 + L_2 + L_3 + L_4)\left(\frac{1}{W} - \frac{T_{tot}}{L_{tot}}\frac{L_t}{W_t}k\right)} = \frac{L_2 + L_3 + L_4}{L_1 + L_2 + L_3 + L_4} \tag{15b}$$

Thus as shown in Equations 15a and 15b, the effect of the parasitic tap resistances may be substantially compensated for by adding extra inaccessible compensation taps, and the resulting transfer function is substantially independent of the parasitic resistances. Furthermore, the taps do not have to be linearly spaced. The requirement that the number of taps in each segment be proportional to the length of each segment has to be valid only at the accessible output taps of interest and not at each extra inaccessible compensation tap. Thus, all the taps in one segment may be lumped at one end of the segment, or they may be linearly spaced, or any combination of the two methods.

Figure 11:
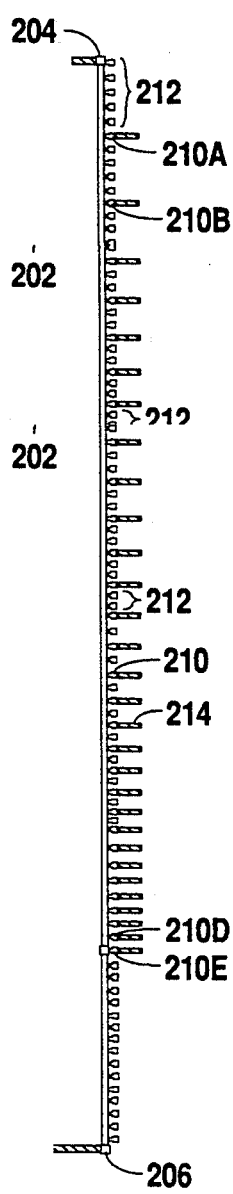
FIG. 11 is a plan view of a integrated circuit resistor voltage divider according to the present invention.

A resistor according to one embodiment of the present invention is shown in FIG. 11. Resistor 200 is comprised of resistor body 202, accessible output taps 210, inaccessible compensation taps 212, and two input connections. Generally one input will be connected to a voltage source and one input will be connected to a ground. However, a ground connection is not required, but rather the second input may be at some other user determined voltage state. In a preferred embodiment, though, input connections of voltage connection 204 and ground connection 206 are provided. FIG. 12 is an expanded view of one accessible output tap 210. Accessible output tap 210 has a contact site 216. Electrical lead 214 is shown in FIG. 12 to illustrate an electrical connection to accessible output tap 210. Electrical lead 214 may be, for example, an aluminum lead.

Resistor body 202 may be, for example, constructed from 3 micron wide polysilicon and the resistor taps may have a total width of 1.5 microns each and a length of 4 microns. It is recognized that other dimensions and materials may be utilized depending on a users specific electrical and space requirements. Thus, the specific dimensions shown in the figures herein are used for illustrative purposes to aid the understanding of the present invention.

As shown in FIG. 11, each accessible output tap 210 is connected with an electrical lead 214 and, thus, resistor 200 has thirty-two accessible output taps 210. It is understood that electrical leads 214 are part of the additional circuitry, such as decoding circuitry, (not shown) that a user may utilize to decode a desired accessible output tap. Inaccessible compensation taps 212 may be found between accessible output taps 210. Inaccessible compensation taps 212 are not connected to electrical leads 214 and are, therefore, not selectable as outputs for the voltage divider. Inaccessible compensation taps 212, however, will lessen the effect of tap resistance as described above. Although inaccessible compensation taps preferable are not connected to electrical leads such as electrical leads 214, in a preferred embodiment inaccessible compensation taps 212 have contact sites 216 that are filled with a contact plug or a small stub of an electrical lead comprising the same material as electric leads 214. A contact plug or a stub will better simulate the interface resistance effects of electric leads 214 such that the resistance of inaccessible compensation taps 212 more closely resembles the resistance of accessible output taps 210.

Alternatively, electrical leads 214 may be connected to every lead. In this embodiment, though, inaccessible compensation taps are still inaccessible because at some point in the decoding circuitry, the structural interconnects required to access the inaccessible compensation taps will be missing. A user, therefore, will not be able to select some taps as either an output or an input. Thus, space requirements and circuit complexity are decreased because every tap does not require corresponding input or decoding circuitry.

Furthermore, the invention provides advantages over circuits in which every tap may be accessed and the user selects the desired tap through user inputs. For example, resistor 200 of the present invention only requires circuitry necessary to access thirty-two taps. If every tap in resistor 200 was accessible and a user chose the desired output taps via user inputs or software as in the prior art, circuitry necessary to access all 103 taps would be required.

Accessible output taps 210 are generally nonlinearly spaced along resistor body 202 in order to provide nonlinearly related voltage outputs. The amount of attenuation between each accessible output tap will vary depending on the user's placement of the accessible output taps for the desired application. A user may also select a desired nonlinear attenuation pattern through the placement of the accessible output taps. For example, accessible outputs may be spaced so that the voltage transfer function follows a logarithmic pattern, square root pattern, inverse pattern or other user selected linear and nonlinear patterns. Nonlinear spacing may even be created by linearly spacing taps over only a portion of the voltage divider. For example, nonlinear spacing is the net effect of a voltage divider that has no taps over the top half of the resistor body and linear spaced taps over the bottom half.

FIG. 11 shows a logarithmic accessible output spacing pattern as one embodiment of the present invention. Accessible output taps 210 are spaced to provide 0.5 db attenuation steps between each accessible output tap. The transfer function of $$\frac{Vout}{Vin}$$

may be expressed in decibels db by taking the log of $$\frac{Vout}{Vin}$$

and multiplying the results by 20. Thus, accessible output tap 210A provides 0.5 db attenuation from voltage connection 204 while accessible output tap 210E provides 16 db attenuation. If resistor body 202 is 1000 microns long from voltage connection 204 to ground connection 206, then, accessible output tap 210A is placed approximately 55.9 microns from voltage connection 204 and accessible output tap 210E is placed approximately 841.5 microns from input connection 204 in order to achieve the desired attenuation at the accessible output taps. The distances such as 55.9 and 841.5 microns may be chosen by using the sheet resistance length and width and assuming ideal resistor conditions without compensating for parasitic tap resistances. Likewise, the remaining accessible output taps are placed to provide the desired attenuation steps.

According to the present invention, the number of taps (including both accessible output and inaccessible compensation taps) in each resistor segment is substantially proportional to the length of each resistor segment. By having an average tap density that is substantially uniform across the length of resistor body 202, the tap impedance effects will be lessened. As used herein, tap density is the number of all taps, accessible and inaccessible together, over a chosen length of the resistor body. In resistor 200, inaccessible compensation taps 212 are, therefore, added between logarithmically spaced accessible output taps 210 in order to maintain a substantially proportional number of total taps (accessible output taps plus inaccessible compensation taps) per unit length of resistor body 202. In resistor 200, for example, a tap density of 1 tap per 10 microns is substantially maintained along the length of resistor body 202. Therefore, numerous inaccessible compensation taps 212 are placed along resistor body 202 between the accessible output taps 210 in order to best maintain the chosen tap density. The choice of tap density will depend on the accuracy requirements, space requirements and manufacturing abilities of the user.

Slight rounding and approximation error may result when the distance between two accessible output taps does not allow an exactly integral number of taps per unit length chosen (ten microns in this example). As seen in FIG. 11, accessible output taps 210A and 210B are 52.8 microns apart and, thus, four inaccessible compensation taps 212 are placed between accessible output taps 210A and 210B and the tap density is one tap per 10.56 microns. Thus, an approximation error results between the desired tap density (one tap per ten microns in the example shown) and the actual density between accessible output taps 210A and 210B. This error may at times be small, though, as seen between accessible output taps 210B and 210C which are 49.9 microns apart and have four inaccessible compensation taps between them and thus yield a tap density of one tap per 9.98 microns. The error between two adjacent taps may increase when the distance between the taps does not provide an accurate placement of inaccessible compensation taps. For example, if the desired tap density is one tap per ten microns and two accessible output taps are spaced by 16 microns, then placing one inaccessible compensation tap between the two accessible output taps will create a density of one tap per eight microns at this segment of the resistor. If the distance between two taps is 13 microns, not placing compensation tap results in one tap per thirteen microns at this segment of the resistor, an error that is less than the error if a compensation tap was placed between the accessible output taps. However, this error for one segment will not be as significant when the tap density over larger portions of the resistor such as three, four or more times the unit length of the tap density are considered. The resulting running average of the tap density is substantially constant as different portions of the resistor are viewed.

It is important to note that the impact of this approximation error is diminished because the overall number of taps per unit length between any given accessible output tap and an input connection, such as ground connection 206 (i.e. the net resistor that is formed from the given accessible output to the ground connection), will be substantially constant. Accessible output taps 210A, 210B and 210E reflect this concept because between accessible output tap 210A and ground connection 206 there is one tap per 9.97 microns, between accessible output tap 210B and ground connection 206 there is one tap per 9.94 microns and between accessible output tap 210E and ground connection 206 there is one tap per 10.06 microns. Likewise, it can be shown that between the accessible output taps and input voltage connection 204 the error from the desired tap density will also be diminished. Thus, although a particular portion of the resistor may not maintain a substantially constant tap density, the net tap density along the whole resistor body and the tap density between any given accessible output tap and an input connection will average to be substantially constant. Thus, the impact of the resistance on the transfer function will be minimized.

It is understood that higher transfer function accuracy may occur as the chosen tap density is increased. However, the obtained improvements must be balanced against a manufacturer's linewidth process capabilities and circuit requirements. Also, it is believed that as taps become too close current spreading effects may cause additional error depending on the geometry of the specific voltage divider. Therefore, current spreading effects may also influence the choice of tap density and the position of taps. For example, in resistor 200, taps are not placed closer than approximately 7.4 microns. Therefore, because the 12.0 db and 12.5 db attenuation accessible output taps are 14.1 microns apart, an inaccessible compensation tap is not placed between the 12.0 db and 12.5 db points in order to avoid current spreading effects. The chosen tap density will, thus, depend on the optimization of multiple factors that may vary between specific intended uses or applications.

Figure 13:
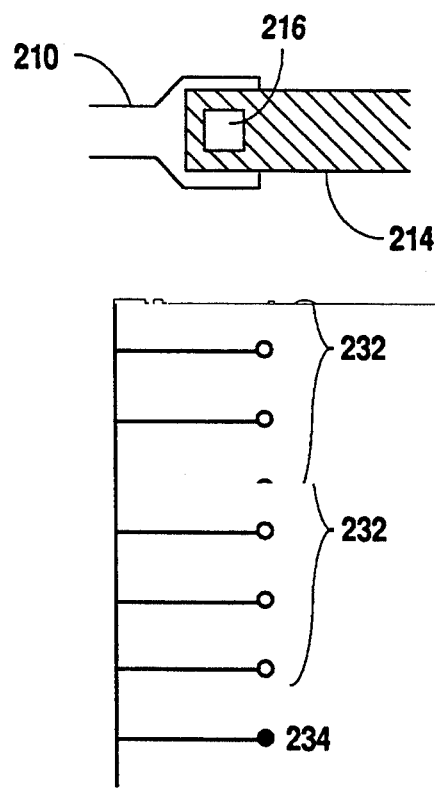
FIG. 13 shows linear spaced inaccessible compensation taps.
Figure 14:
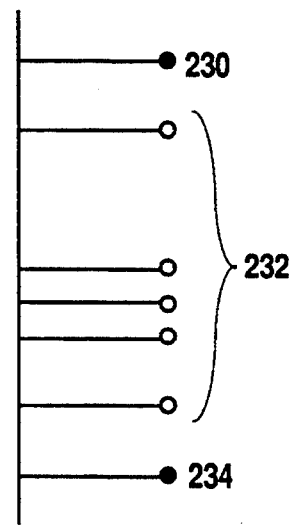
FIG. 14 shows nonlinear spaced inaccessible compensation taps.

Because it is desired to create a substantially constant average tap density between accessible output taps, the inaccessible compensation taps between accessible output taps do not have to be linearly spaced. FIGS. 13 and 14 show a portion of a resistor made in accordance with the present invention. In FIG. 13, inaccessible compensation taps 232 are linearly spaced between accessible output taps 230 and 234. In FIG. 14, inaccessible compensation taps 232 are nonlinearly spaced between accessible output taps 230 and 234. However, the average tap density per unit length between accessible taps in the resistor segment shown in both FIGS. 13 and 14 is the same and either arrangement would have a similar effect as used in the present invention.

Figure 15:
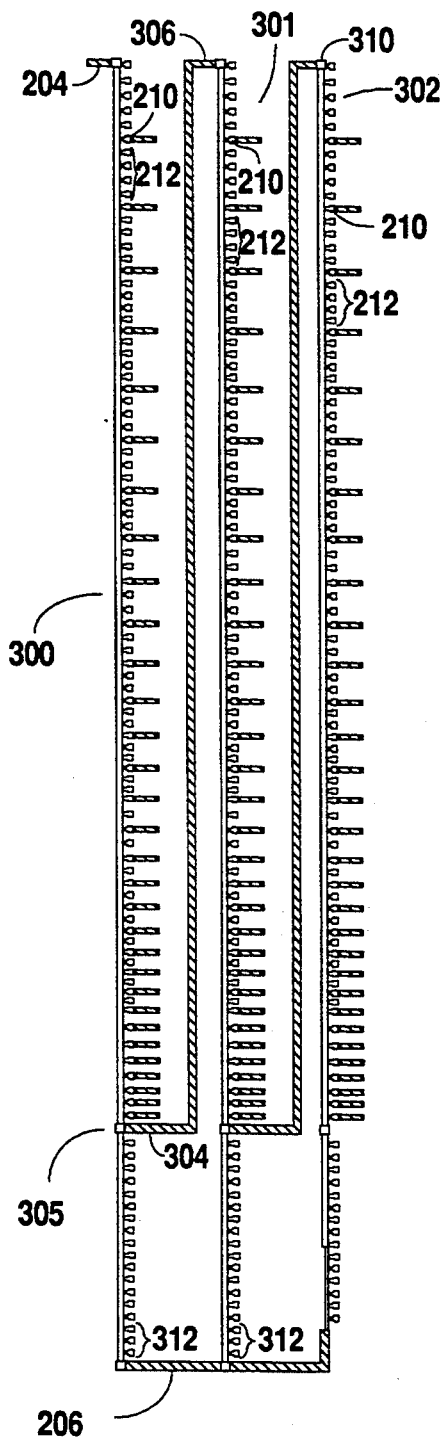
FIG. 15 shows multiple integrated circuit resistor voltage dividers connected according to the present invention.

A group of resistors such as resistor 200 in FIG. 11 may be connected as shown in FIG. 15. In FIG. 15, resistors 300, 301, and 302 each have ground connection 206, accessible output taps 210 and inaccessible compensation taps 212. Resistor 300 has voltage connection 204. Resistor 301 is connected to resistor 300 through connector 304. Connector 304 is preferably a low resistance material such as aluminum. Connector 304 is electrically connected to resistor 300 at contact 305 and connected to resistor 301 at contact 306. Resistor 301 is, therefore, in parallel with the bottom resistive portion of resistor 300 which is between contact 305 and ground connection 206 of resistor 300. Resistor 302 may be similarly connected to resistor 301.

Resistors 300 and 301 are 1033 microns long from voltage connection 204 to ground connection 206 and contact 305 to ground connection 206 respectively. Resistor 302, the last resistor in the chain of resistors, is 1000 microns from contact 310 to ground connection 206, thus, resistor 302 is slightly shorter than the other resistors because no resistors are placed in parallel with the bottom portion of resistor 302. Additional length is added to all resistors except the last resistor in the chain in order to compensate for the subsequent resistors placed in parallel with the bottom portion of each resistor. The effective resistance from one end of resistor 302 to the opposite end of resistor 302 is therefore approximately equivalent to the resistance seen between the top of resistor 300 and ground. As seen in FIG. 15, three additional inaccessible compensation taps 312 are added to the 33 microns of additional length of resistors 300 and 301. Furthermore, the placement of accessible compensation taps 210 in resistors 300 and 301 is calculated independent of the additional length added to these resistors. Thus for each resistor, accessible output taps 210 are placed the same distances from the top of each resistor (i.e. voltage connection 204 for resistor 300, contact 306 for resistor 301, and contact 310 for resistor 302) as shown in FIG. 15.

By connecting multiple resistors in parallel as shown in FIG. 15, additional attenuation may be achieved. For example, similar to resistor 200 of FIG. 11, resistor 300 may provide accessible output taps for 0.5 to 16 db attenuation. Resistor 301 may then provide accessible outputs for 16.5 to 32 db attenuation and resistor 302 may provide accessible outputs for 32.5 to 48 db attenuation. More resistors may be added in this manner in order to achieve even higher attenuation.

Figure 17:
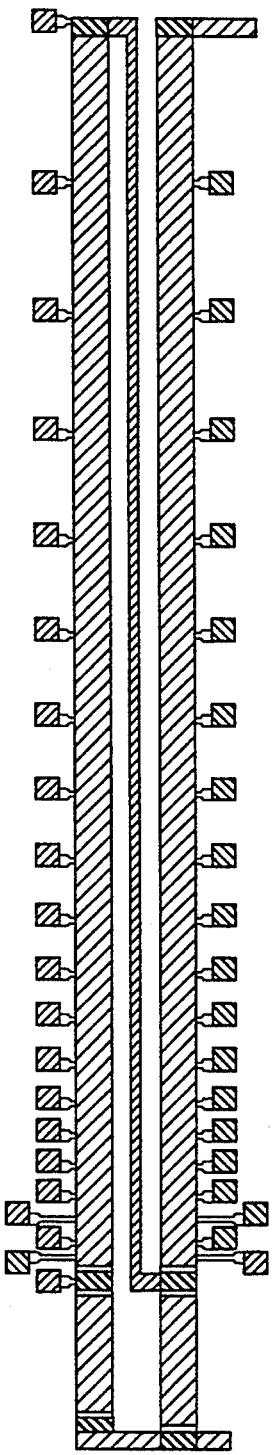
FIG. 17 is a plan view of the resistor voltage divider without inaccessible compensation taps used to generate the data shown in FIG. 16.
Figure 19:
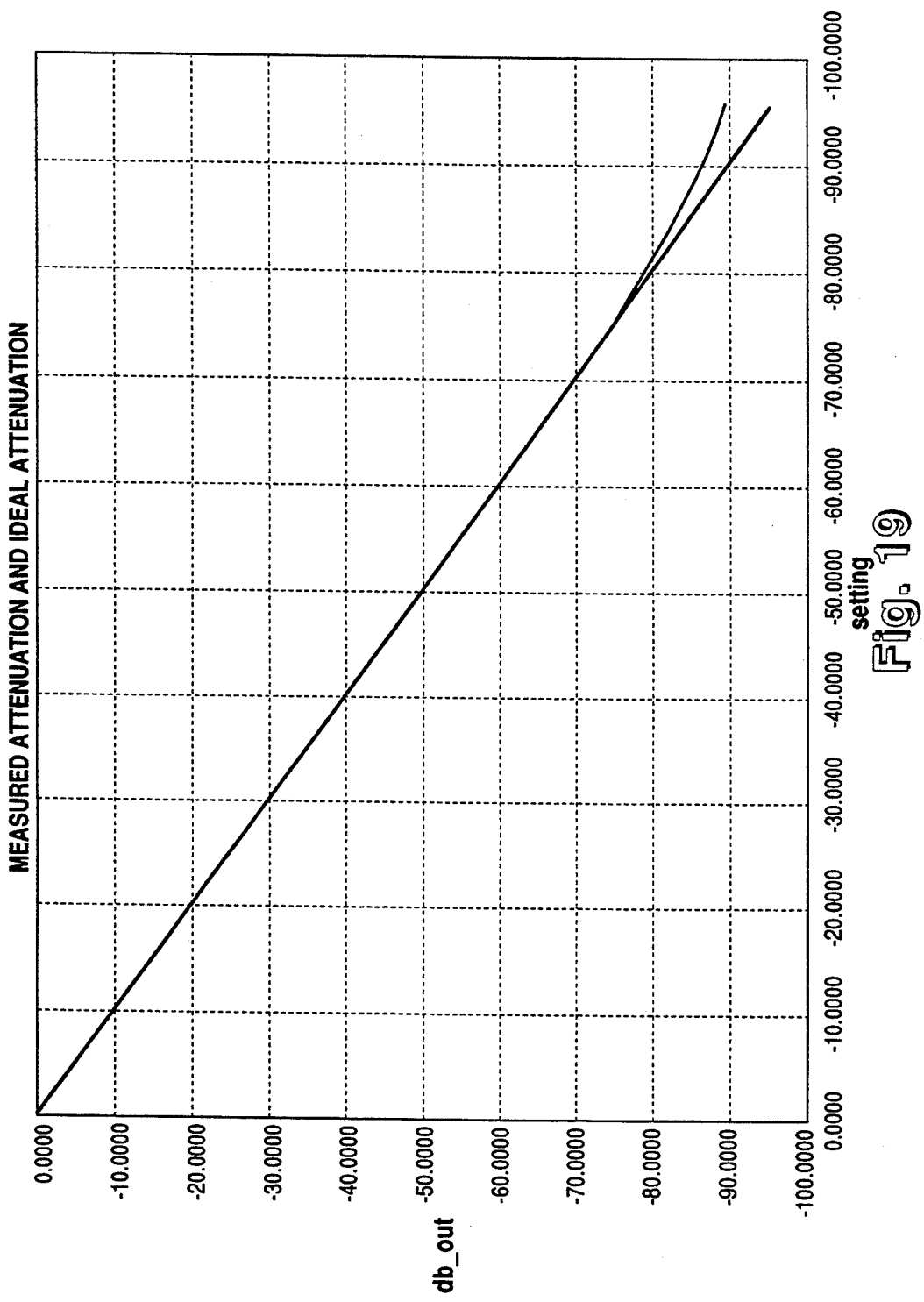
FIG. 19 is an expanded graph of the graph shown in FIG. 18.

The advantages resulting from adding inaccessible compensation taps may be seen by comparing the measured attenuation verses ideal logarithmic attenuation plot for both logarithmic resistors with and without inaccessible compensation taps. FIG. 16 shows the ideal verses measured attenuation plot for the logarithmic voltage divider shown in FIG. 17 which does not include inaccessible compensation taps. In FIG. 16, line B represents the ideal plot and line A represents the measured data. FIG. 18 shows a comparable ideal verses measured attenuation plot for using the present invention with inaccessible compensation taps. In FIG. 18, the ideal plot and measured data generally overlap. The data shown in FIG. 18 may be obtained by using six resistors such as resistor 200 in FIG. 11 and connecting the resistors in the manner shown in FIG. 15. As can be seen by comparing FIGS. 16 and 18, increased accuracy may be obtained by adding inaccessible compensation taps. Because FIG. 18 is generated from six 16 db voltage dividers, a total of 96 db attenuation may be obtained. FIG. 19 demonstrates the measured verse ideal attenuation over the entire range of the 96 db voltage divider.

Voltage dividers that do not utilize side taps but rather place taps directly within the main body of the resistor, such as resistor 1 shown in FIG. 1, may also utilize the advantages of the present invention. In FIG. 1, each tap 2 will cause a variation from the ideal electrical attenuation characteristics of resistor 1. By adding extra inaccessible compensation taps, the variation from the ideal attenuation may be lessened. Similar to the placement of side taps, it is desirable to place extra inaccessible compensation taps that are within the resistor body such that at each accessible output tap the number of taps in each resistor segment is substantially proportional to the length of each segment. Thus, the advantages of the present invention are not limited to side extensions but also may be used in other tap or contact arrangements.

Figure 20:
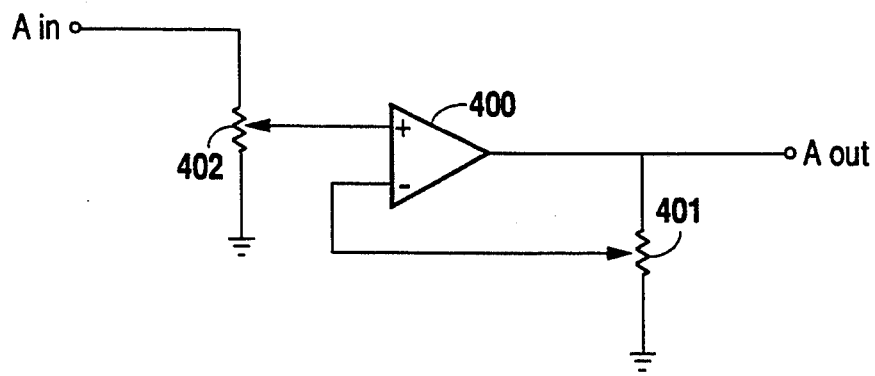
FIG. 20 is an amplifier circuit according to the present invention.

The voltage divider of the present invention also provides improved accuracy that is useful in amplifier circuits. FIG. 20 shows amplifier 400 connected with voltage dividers 401 and 402. Voltage dividers 401 and 402 are resistor voltage dividers such as resistor 200 of FIG. 11 or multiple resistors connected as shown in FIG. 15. Voltage divider 401 is connected to the inverting feedback input of amplifier 400 and voltage divider 402 is connected to the noninverting signal input of amplifier 400 in order to operate and control the amplifier output. The improved accuracy in controlling the amplifier input signal $A_{in}$ with voltage divider 402 and controlling the amplifier gain with voltage divider 401 provides a more accurate amplifier output signal $A_{out}$.

Figure 21:
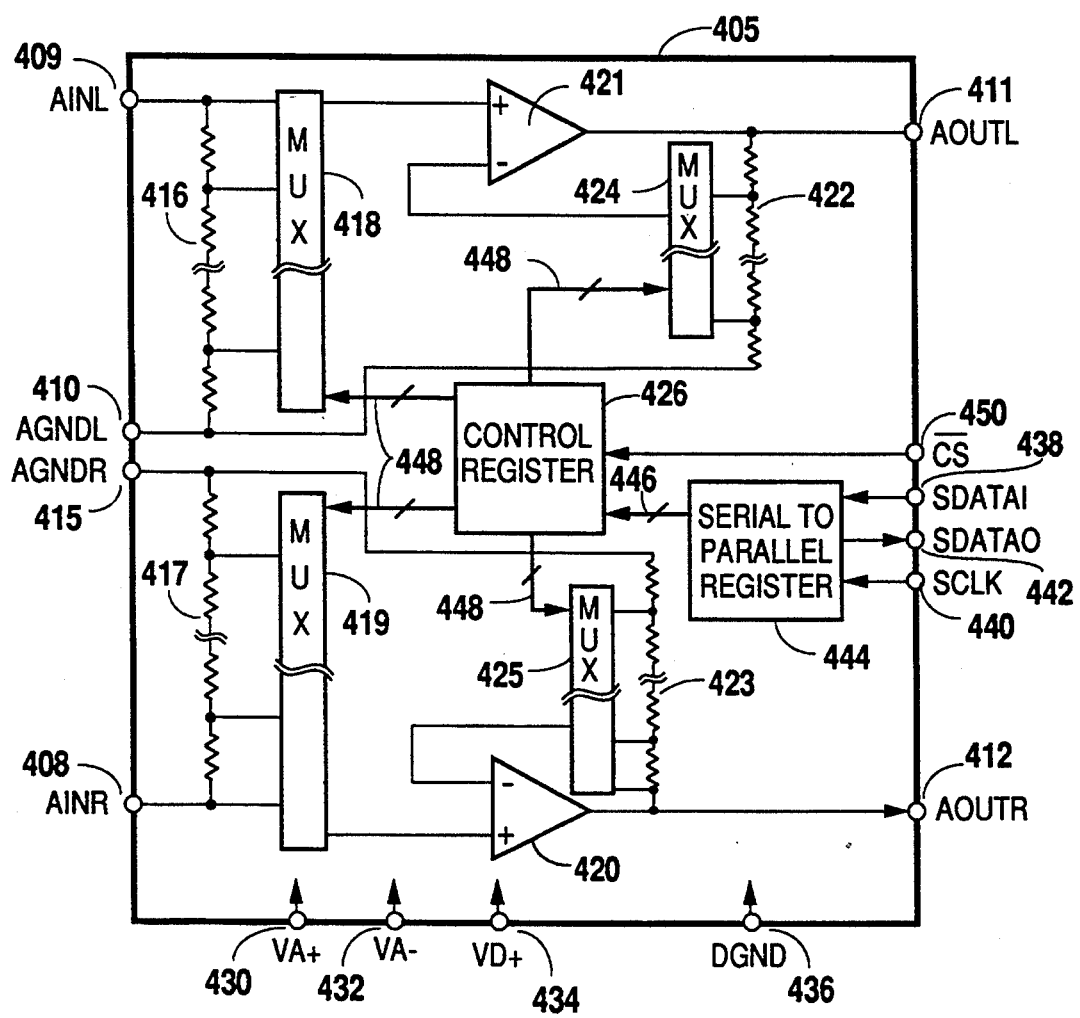
FIG. 21 is a volume control circuit according to the present invention.

The accuracy of the amplifier circuit shown in FIG. 20 is particularly useful in volume control applications for audio systems. FIG. 21 illustrates stereo volume control circuit 405 that may utilize the present invention. Volume control circuit 405 has left and right analog signal input pins 409 and 408, left and right analog signal output pins 411 and 412, and analog ground pins 415 and 410. The right channel utilizes amplifier 420 and the left channel utilizes amplifier 421. The amplifier noninverting input signals are attenuated with voltage dividers 416 and 417. The amplifier feedback is controlled with voltage dividers 422 and 423. Each voltage divider 416, 417, 422, and 423 is a logarithmic voltage divider providing up to 96 db attenuation through six 16 db resistors that utilize inaccessible compensation taps according to the principles described above and connected as shown in FIG. 15. The specific accessible output taps of voltage dividers 416, 417, 422 and 423 are decoded with multiplexers 418, 419, 424 and 425 respectively. Multiplexers 418, 419, 424 and 425 can be designed in a number of ways that are well known in the art.

Volume control circuit 405 may have additional power supply connections such as positive analog power pin 430, negative analog power pin 432, positive digital power pin 434 and digital ground pin 436. Digital input data that sets the analog output levels is provided to the circuit through serial data input pin 438. Serial clock pin 440 clocks in the individual bits of data from serial data input pin 438. The serial data may also be output through serial data output pin 442. The serial input data is converted to parallel data by serial to parallel register 444.

The input data is then provided through bus 446 to control register 426. Data is latched into control register according to a chip select signal at chip select pin 450. Control register 426 calculates desired amplifier noninverting signal input and inverting feedback input levels from the input data. For example, if it is desired to attenuate an analog input signal, the amplifier gain may be set to one and the signal may be attenuated with dividers 416 or 417. Alternatively if a gain is desired from the analog input to the analog output, zero attenuation may be chosen at dividers 416 and 417 while the desired feedback is selected through dividers 422 and 423. Further, a user could use many other combinations of input attenuation and feedback to achieve a desired output.

Control register 426 decodes the parallel input data into desired multiplexer control signals via a NOR gate array. However, other methods, such as look up tables may be used. Having calculated the desired amplifier levels, control register 426 delivers multiplexer control signals via buses 448 to multiplexers 418, 419, 424, and 425. The multiplexer control signals enable multiplexers 418, 419, 424 and 425 to decode the specific accessible output taps of voltage dividers 416, 417, 422 and 423 that correspond to the desired amplifier levels calculated by control register 426.

Further modifications and alternative embodiments of this invention will be apparent to those skilled in the art in view of this description. Accordingly, this description is to be construed as illustrative only and is for the purpose of teaching those skilled in the art the manner of carrying out the invention. It is to be understood that the forms of the invention herein shown and described are to be taken as the presently preferred embodiments. Various changes may be made in the shape, size, and arrangement of parts. For example, equivalent elements or materials may be substituted for those illustrated and described herein, and certain features of the invention may be utilized independently of the use of other features, all as would be apparent to one skilled in the art after having the benefit of this description of the invention.

What is claimed is:

1. A resistor voltage divider, comprising:
a resistor body; and
a plurality of taps distributed along said resistor body, said plurality of taps including,
a plurality of accessible output taps, and
at least one inaccessible compensation tap whereby the at least one inaccessible compensation tap compensates for parasitic resistance.

2. The voltage divider of claim 1, wherein said plurality of accessible output taps are nonlinearly distributed along said resistor body.

3. The voltage divider of claim 2, wherein said plurality of accessible output taps are distributed along said resistor body in a substantially logarithmically spaced pattern.

4. The voltage divider of claim 1, wherein said taps are distributed along said resistor body whereby a tap density per unit length of said resistor body is substantially constant over at least a portion of said resistor body, said portion being longer than said unit length.

5. The voltage divider of claim 1, said plurality of taps further including an input tap, said plurality of taps being distributed along said resistor body whereby a tap density between a first accessible output tap and said input tap is substantially equal to a tap density between a second accessible output tap and said input tap.

6. The voltage divider of claim 5, wherein said plurality of taps are distributed along said resistor body whereby a tap density between each accessible output tap and said input tap is substantially constant.

7. The voltage divider of claim 6, wherein said plurality of accessible output taps are nonlinearly distributed along said resistor body.

8. The voltage divider of claim 7, wherein said plurality of accessible output taps are substantially logarithmically distributed along said resistor body.

9. The voltage divider of claim 6, wherein said plurality of taps are substantially linearly spaced along said resistor body.

10. The voltage divider of claim 9, wherein said plurality of accessible output taps are nonlinearly distributed along said resistor body.

11. A voltage divider circuit, comprising:
an integrated circuit resistor body;
a plurality of taps distributed along said resistor body;
a plurality of electrical leads connected to at least two of said plurality of taps; and
a tap selection circuit connected to said electrical leads, said tap selection circuit capable of selecting for electrical connection some, but not all of said taps, whereby at least one of said taps is not selectable and at least two of said taps are selectable.

12. The voltage divider circuit of claim 11, said plurality of taps comprising:
a plurality of accessible output taps; and
at least one inaccessible compensation tap;
wherein said at least one inaccessible compensation tap being distributed along said resistor body to substantially minimize a tap resistance error in a transfer function of said voltage divider circuit.

13. The voltage divider circuit of claim 11, said at least one inaccessible compensation tap being structurally disconnected from an input of said tap selection circuit.

14. A method of making a voltage divider, comprising:
providing an integrated circuit resistor body;
placing a plurality of accessible output taps along said resistor body, said accessible output taps being spaced in a nonlinear pattern to create a plurality of nonlinear resistor segments between adjacent accessible output taps; and
placing a plurality of inaccessible compensation taps along said resistor body, said inaccessible compensation taps placed at positions along said resistor body to substantially minimize tap resistance effects.

15. The method of claim 14, further comprising:
selecting a predetermined tap density;
wherein said step of placing a plurality of inaccessible compensation taps further includes placing said inaccessible compensation taps to substantially maximize an equality of a tap density of each of said nonlinear resistor segments to said predetermined tap density.

16. The method of claim 15, wherein said placing a plurality of inaccessible taps step further includes placing said inaccessible taps whereby together the placing of said accessible taps and the placing of said inaccessible taps creates a substantially linear tap spacing along said resistor body.

17. An integrated circuit amplifier circuit, comprising:
   an amplifier; and
   a first resistor voltage divider operatively connected to said amplifier, said first resistor voltage divider comprising,
      a first resistor body,
      a first plurality of taps distributed along said first resistor body, said first plurality of taps including,
         a first plurality of accessible output taps, said first plurality of accessible output taps being nonlinearly spaced,
         at least one first inaccessible compensation tap, and
         a first input tap;
   said first plurality of taps being distributed along said first resistor body whereby a tap density between a first accessible output tap and said first input tap is substantially equal to a tap density between a second accessible output tap and said first input tap.

18. The amplifier circuit of claim 17, further comprising:
   a first end and a second end of said first resistor voltage divider, one of said ends connected to a voltage source;
   wherein at least one of said first plurality of accessible output taps is connectable to a signal input of said amplifier for applying at least a portion of a voltage at said voltage source to said signal input.

19. The amplifier of claim 17, further comprising:
   a first end and a second end of said first resistor voltage divider, one of said ends connected to a signal output of said amplifier;
   wherein at least one of said first plurality of accessible output taps is connectable to a feedback input of said amplifier for applying at least a portion of a voltage at said signal output to said feedback input of said amplifier.

20. The amplifier of claim 17, wherein said first resistor voltage divider is operatively connected to a signal input of said amplifier, and further comprising:
   a second resistor voltage divider operatively connected to a feedback input of said amplifier, said second resistor voltage divider comprising,
      a second plurality of taps distributed along said second resistor body, said second plurality of taps including,
         a second plurality of accessible output taps, said second accessible output taps being nonlinearly spaced,
         at least one second inaccessible tap, and
         a second input tap;
   said second plurality of taps distributed along said second resistor body whereby a tap density between a third accessible output tap and said second input tap is substantially equal to a tap density between a fourth accessible output tap and said second input tap.

21. A nonlinear volume control circuit for conditioning an audio signal, comprising:
   an amplifier;
   a first and second resistor voltage divider, each of said voltage dividers comprising,
      a resistor body,
      a plurality of taps distributed along said resistor body, said plurality of taps including,
         a plurality of accessible output taps, said accessible output taps being nonlinearly spaced,
         at least one inaccessible compensation tap, and
         an input tap
   said plurality of taps distributed along said resistor body whereby a tap density between a first accessible output tap and said input tap is substantially equal to a tap density between a second accessible output tap and said input tap;
   a first multiplexer circuit, for decoding one of said plurality of accessible output taps in response to a first multiplexer input signal and for connecting one of said plurality of accessible taps of said first resistor to a signal input of said amplifier; and
   a second multiplexer circuit, for decoding one of said plurality of accessible output taps in response to a second multiplexer input signal and for connecting one of said plurality of accessible taps of said second resistor to a feedback input of said amplifier.

22. The circuit of claim 21, further comprising:
   a plurality of electrical leads connecting said plurality of accessible output taps and said first and second multiplexer circuits;
   wherein said at least one inaccessible compensation tap being structurally disconnected from said first and second multiplexer circuits.

* * * * *

UNITED STATES PATENT AND TRADEMARK OFFICE
CERTIFICATE OF CORRECTION

PATENT NO. : 5,339,067

DATED : August 16, 1994

INVENTOR(S) : Larry L. Harris and Baker P.L. Scott, III

It is certified that error appears in the above-identified patent and that said Letters Patent is hereby corrected as shown below:

In claim 14, column 16, line 61, after "effects", insert -- whereby the inaccessible compensation taps compensate for parasitic resistance.--

In claims 17-22, delete entire claims.

Signed and Sealed this

Fifteenth Day of August, 1995

Attest:

BRUCE LEHMAN

Attesting Officer

Commissioner of Patents and Trademarks